(12) United States Patent
Akutagawa et al.

(10) Patent No.: US 11,057,034 B2
(45) Date of Patent: Jul. 6, 2021

(54) SEMICONDUCTOR RELAY MODULE

(71) Applicant: Omron Corporation, Kyoto (JP)

(72) Inventors: Toshinobu Akutagawa, Kumamoto (JP); Yosuke Morimoto, Koshi (JP); Tetsuro Tsurusu, Takatsuki (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 16/641,546

(22) PCT Filed: Dec. 22, 2017

(86) PCT No.: PCT/JP2017/046078
§ 371 (c)(1),
(2) Date: Feb. 24, 2020

(87) PCT Pub. No.: WO2019/043969
PCT Pub. Date: Mar. 7, 2019

(65) Prior Publication Data
US 2020/0228114 A1 Jul. 16, 2020

(30) Foreign Application Priority Data
Aug. 31, 2017 (JP) .............................. JP2017-167401

(51) Int. Cl.
*H03K 17/687* (2006.01)
*H03K 17/78* (2006.01)
*H03K 17/968* (2006.01)

(52) U.S. Cl.
CPC ........... *H03K 17/687* (2013.01); *H03K 17/78* (2013.01); *H03K 17/968* (2013.01)

(58) Field of Classification Search
CPC ...... H03K 17/10; H03K 17/102; H03K 17/12; H03K 17/122; H03K 17/56; H03K 17/687; H03K 17/6874; H03K 17/6877; H03K 17/6878; H03K 17/78; H03K 17/785;
(Continued)

(56) References Cited

U.S. PATENT DOCUMENTS 5,559,466 A  9/1996 Okumura et al.

FOREIGN PATENT DOCUMENTS

| JP | S55-93140 U | 6/1980 |
| JP | H07-46109 A | 2/1995 |
| JP | H11-27124 A | 1/1999 |

OTHER PUBLICATIONS

International Search Report issued in Application No. PCT/JP2017/046078, dated Mar. 6, 2018 (5 pages).
(Continued)

*Primary Examiner* — Diana J. Cheng
(74) *Attorney, Agent, or Firm* — Osha Bergman Watanabe & Burton LLP

(57) ABSTRACT

In a semiconductor relay module, inside a package, one of a pair of input parts of a first semiconductor relay is connected to a first input terminal, the other of the pair of input parts of the first semiconductor relay is connected to a second input terminal, one of a pair of input parts of a second semiconductor relay is connected to the second input terminal, the other of the pair of input parts of the second semiconductor relay is connected to the first input terminal, one of a pair of input parts of a third semiconductor relay is connected to a third input terminal, and the other of the pair of input parts of the third semiconductor relay is connected to the first input terminal or the second input terminal.

14 Claims, 3 Drawing Sheets

(58) Field of Classification Search
CPC ............... H03K 17/965; H03K 17/968; H03K 2217/00; H03K 2217/0009; H03K 2217/0054
See application file for complete search history.

(56) References Cited

OTHER PUBLICATIONS

Written Opinion issued in International Application No. PCT/JP2017/046078, dated Mar. 6, 2018 (8 pages).

SEMICONDUCTOR RELAY MODULE

TECHNICAL FIELD

The present disclosure relates to a semiconductor relay module.

BACKGROUND ART

Patent Document 1 discloses a semiconductor relay module including two sets of metal-oxide-semiconductor field-effect transistors (MOSFETs) connected in series and a semiconductor switch provided between a connection midpoint between these two sets of MOSFETs and a grounding point. In this semiconductor relay module, each set of MOSFTs is made up of two MOSFETs connected in reverse series, and a photodiode array is connected to each of the two MOSFETs. By causing a light-emitting diode (LED) to emit light, each photodiode array generates an electromotive force to turn on the connected MOSFET. That is, in the semiconductor relay, two sets of MOSFETs are simultaneously turned on and off depending on whether or not the LED emits light.

PRIOR ART DOCUMENT

Patent Document

Patent Document 1: Japanese Unexamined Patent Publication No. H7-46109

SUMMARY OF THE INVENTION

Problems to be Solved by the Invention

However, in the above semiconductor relay module, the LED for turning on and off each set of MOSFETs is connected via two terminals for each set, which may complicate the wiring and make circuit board design difficult.

Therefore, an object of the present disclosure is to provide a semiconductor relay module that can facilitate designing of a circuit board.

Means for Solving the Problem

An example of the semiconductor relay module of the present disclosure is a semiconductor relay module including:
a first semiconductor relay and a second semiconductor relay connected in series;
a third semiconductor relay disposed between a grounding point and a connection midpoint of the first semiconductor relay and the second semiconductor relay; a package configured to house the first semiconductor relay, the second semiconductor relay, and the third semiconductor relay; and a first input terminal, a second input terminal, and a third input terminal that are provided in the package and disposed so as to be partially exposed to an outside of the package. Each of the first semiconductor relay, the second semiconductor relay, and the third semiconductor relay has a pair of input portions, and inside the package, one of the pair of input parts of the first semiconductor relay is connected to the first input terminal, another of the pair of input parts of the first semiconductor relay is connected to the second input terminal, one of the pair of input parts of the second semiconductor relay is connected to the second input terminal, another of the pair of input parts of the second semiconductor relay is connected to the first input terminal, one of the pair of input parts of the third semiconductor relay is connected to the third input terminal, and another of the pair of input parts of the third semiconductor relay is connected to the first input terminal or the second input terminal.

Effect of the Invention

According to the semiconductor relay module, a pair of input parts of each semiconductor relay is connected to one input terminal corresponding to each semiconductor relay inside the package. That is, since each semiconductor relay is provided with one corresponding input terminal, it is possible to achieve a semiconductor relay module that can facilitate designing of a circuit board.

MODE FOR CARRYING OUT THE INVENTION

Hereinafter, an example of the present disclosure will be described with reference to the accompanying drawings. In the following description, terms indicating specific directions or positions (e.g., terms including "upper", "lower", "right", and "left") are used as necessary. However, these terms are used to facilitate understanding of the invention with reference to the drawings, and the meanings of the terms do not limit the technical scope of the present disclosure. The following description is merely exemplary in nature and not intended to limit the present disclosure, its application, or its usage. Further, the drawings are schematic, and ratios of dimensions or the like do not necessarily agree with actual ones.

Figure 1:
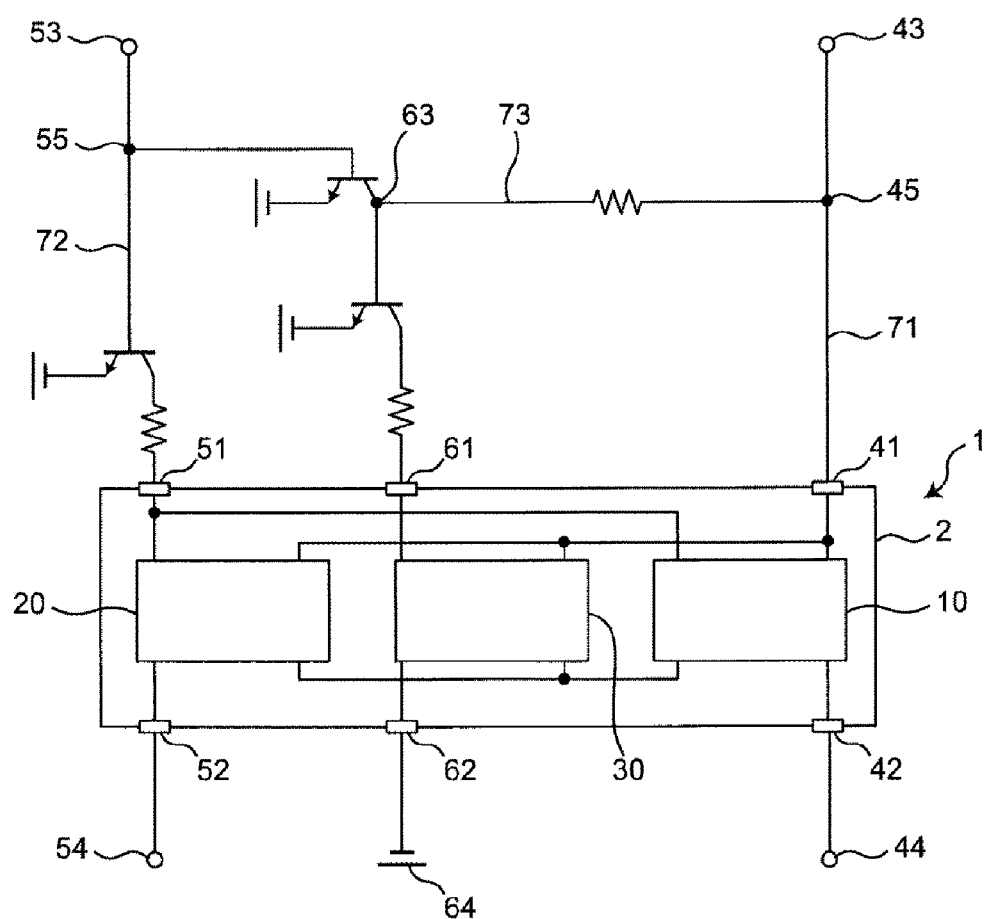
FIG. 1 is a circuit configuration diagram using a semiconductor relay module according to an embodiment of the present disclosure.

FIG. 1 shows an example of a circuit configuration diagram using a semiconductor relay module 1 which is an example of the present disclosure. As shown in FIG. 1, the semiconductor relay module 1 includes a first semiconductor relay 10, a second semiconductor relay 20, and a third semiconductor relay 30, a package 2 housing on its inside the first semiconductor relay 10, the second semiconductor relay 20, and the third semiconductor relay 30, and a first input terminal 41, a second input terminal 51, and a third input terminal 61 that are provided in the package 2.

Each of the first input terminal 41, the second input terminal 51, and the third input terminal 61 is disposed so as to be partially exposed to the outside of the package 2. The first input terminal 41 is connected to the power supply terminal 43 to which a power supply voltage VCC is supplied, and the second input terminal 51 is connected to a CONT terminal 53. Further, a third input terminal 61 is connected to a midpoint 63 of a connection line 73 that connects a midpoint 45 of a connection line 71 connecting the first input terminal 41 and a power supply terminal 43, and a midpoint 55 of a connection line 72 connecting the second input terminal 51 and the CONT terminal 53.

The semiconductor relay module 1 further includes a first output terminal 42, a second output terminal 52, and a third output terminal 62 provided in the package 2. Each of the first output terminal 42, the second output terminal 52, and the third output terminal 62 is disposed so as to be partially exposed to the outside of the package 2. The first output terminal 42 is connected to a first external output terminal 44, the second output terminal 52 is connected to a second external output terminal 54, and the third output terminal 62 is connected to a grounding point 64.

Figure 2:
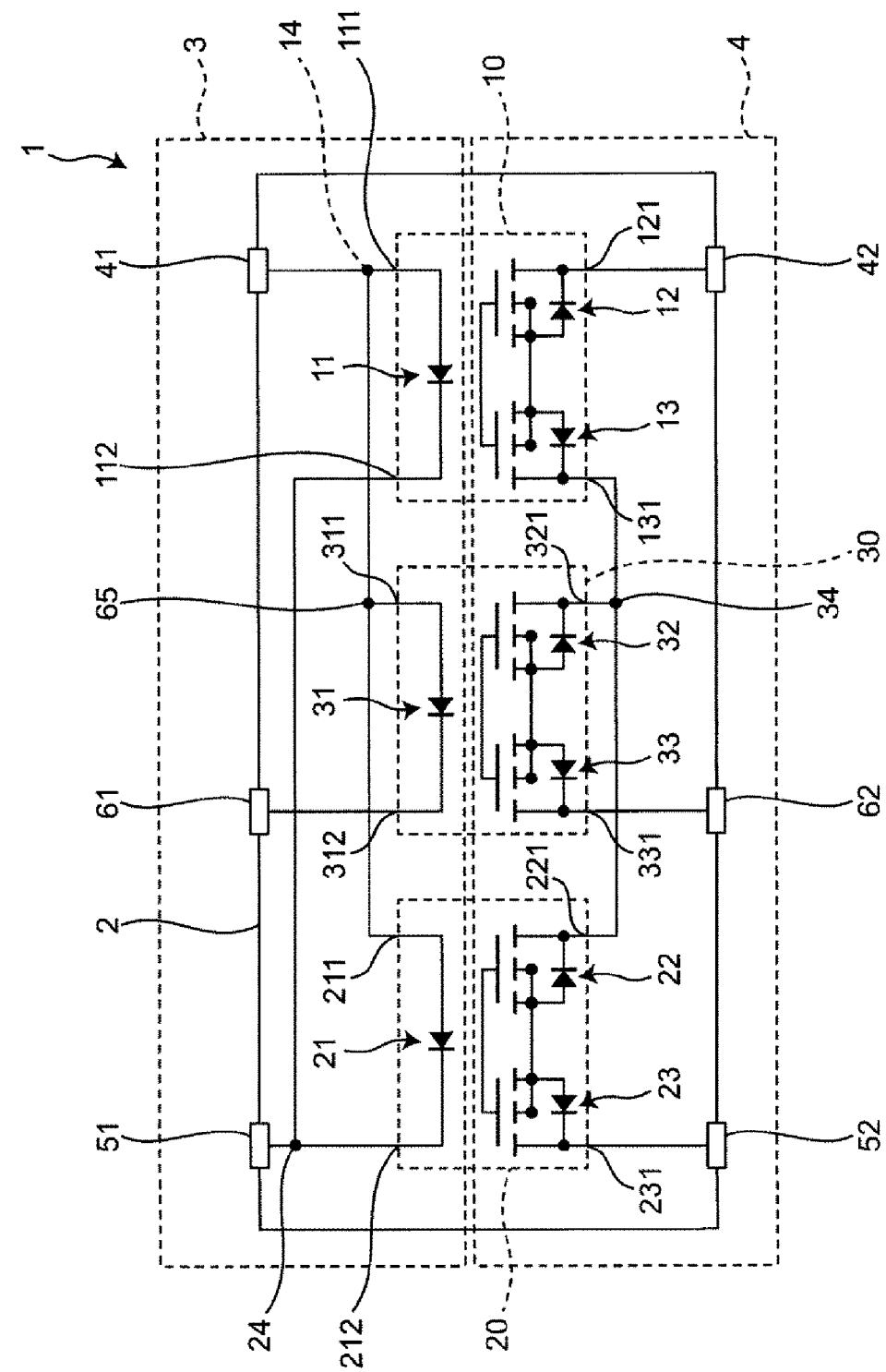
FIG. 2 is a configuration diagram of the semiconductor relay module of FIG. 1.

As shown in FIG. 2, in the semiconductor relay module 1, inside the rectangular package 2 in a plan view of FIG. 2, the first semiconductor relay 10, the second semiconductor relay 20, and the third semiconductor relay 30 are arranged along the longitudinal direction of the package 2, and the third semiconductor relay 30 is disposed between the first semiconductor relay 10 and the second semiconductor relay 20. It is thereby possible to achieve the semiconductor relay module 1 with the components made compact in the short direction of the package 2.

In the semiconductor relay module 1, the first semiconductor relay 10 and the second semiconductor relay 20 are connected in series with each other, and the third semiconductor relay 30 is disposed between the grounding point 64 (shown in FIG. 1) and connection midpoints 34, 65 of the first semiconductor relay 10 and the second semiconductor relay 20.

The first semiconductor relay 10, the second semiconductor relay 20, and the third semiconductor relay 30 include first input parts 111, 211, 311 and second input parts 112, 212, 312, respectively, which are pairs of input parts. The pairs of input parts 111, 211, 311, 112, 212, 312 of the respective semiconductor relays 10, 20, 30 are connected with the respective input terminals 41, 51, 61 inside the package 2, and input signals from the power supply terminal 43 and the CONT terminal 53 are input into the respective semiconductor relays 10, 20, 30 via the respective input terminals 41, 51, 61.

Specifically, the respective semiconductor relays 10, 20, 30 include: light-emitting elements 11, 21, 31 that are connected to the respective input parts 111, 211, 311, 112, 212, 312 and emit light in accordance with signals input via the respective input parts 111, 211, 311, 112, 212, 312; and two MOSFETs 12, 13, two MOSFETs 22, 23, and two MOSFETs 32, 33 that are connected in series so that the directions of parasitic diodes are opposite to each other, the MOSFETs being turned on and off in accordance with whether or not the light-emitting elements 11, 21, 31 emit light.

The first input part 111 of the first semiconductor relay 10 is connected to the first input terminal 41. Further, the second input part 112 of the first semiconductor relay 10 is connected to the second input terminal 51 via a midpoint 24 of a connection line connecting the second input part 212 of the second semiconductor relay 20 and the second input terminal 51.

The second input part 212 of the second semiconductor relay 20 is connected to the second input terminal 51. Further, the first input part 211 of the second semiconductor relay 20 is connected to the first input terminal 41 via a midpoint 14 of a connection line connecting the first input part 111 of the first semiconductor relay 10 and the first input terminal 41.

The second input part 312 of the third semiconductor relay 30 is connected to the third input terminal 61. Further, the first input part 311 of the third semiconductor relay 30 is connected to the first input terminal 41 via a connection midpoint 65 between the first semiconductor relay 10 and the second semiconductor relay 20 (i.e., a midpoint of a connection line connecting the first input part 211 of the second semiconductor relay 20 and the midpoint 14 of the connection line connecting the first input part 111 of the first semiconductor relay 10 and the first input terminal 41)

That is, in the semiconductor relay module 1, the light-emitting elements 11, 21, 31 of the semiconductor relays 10, 20, 30 and the respective input terminals 41, 51, 61 constitute the input circuit unit 3. In the input circuit unit 3, inside the package 2, one of the pair of input parts 111, 112 of the first semiconductor relay 10 is connected to the first input terminal 41, and the other of the pair of input parts 111, 112 of the first semiconductor relay 10 is connected to the second input terminal 51. Further, inside the package 2, one of the pair of input parts 211, 212 of the second semiconductor relay 20 is connected to the second input terminal 51, and the other of the pair of input parts 211, 212 of the second semiconductor relay 20 is connected to the first input terminal 41. Moreover, inside the package 2, one of the pair of input parts 311, 312 of the third semiconductor relay 30 is connected to the third input terminal 61, and the other of the pair of input parts 311, 312 of the third semiconductor relay 30 is connected to the first input terminal 41.

Further, the first semiconductor relay 10, the second semiconductor relay 20, and the third semiconductor relay 30 include pairs of output parts 121, 131, 221, 231, 321, 331, respectively. The pairs of output parts 121, 131, 221, 231, 321, 331 of the respective semiconductor relays 10, 20, 30 are connected with the respective output terminals 42, 52, 62 inside the package 2, and output signals from the respective semiconductor relays 10, 20, 30 are output via the respective output terminals 42, 52, 62.

Specifically, respective MOSFETs 12, 13, 22, 23, 32, 33 of the first semiconductor relay 10, the second semiconductor relay 20, and the third semiconductor relay 30 include the output parts 121, 131, 221, 231, 321, 331, respectively.

The output part 121 of the MOSFET 12 of the first semiconductor relay 10 is connected to the first output terminal 42, the output part 231 of the MOSFET 23 of the second semiconductor relay 20 is connected to the second output terminal 52, and the output part 331 of the MOSFET 33 of the third semiconductor relay 30 is connected to the third output terminal 62. Further, the output part 131 of the MOSFET 13 of the first semiconductor relay 10 and the output part 221 of the MOSFET 22 of the second semiconductor relay 20 are connected by the connection line, and to the midpoint (i.e., connection midpoint) 34 of the connection line, the output part 321 of the MOSFET 32 of the third semiconductor relay 30 is connected That is, in the semiconductor relay module 1, the MOSFETs 12, 13, 22, 23, 32, 33 of the semiconductor relays 10, 20, 30 and the respective output terminals 42, 52, 62 constitute an output circuit unit 4. In the output circuit unit 4, inside the package 2, one of the pair of output parts 121, 131 of the first semiconductor relay 10 is connected to the first output terminal 42, one of the pair of output parts 221, 231 of the second semiconductor relay 20 is connected to the second output terminal 52, and the other of the pair of output parts 121, 131 of the first semiconductor relay 10 and the other of the pair of the output parts 221, 231 of the second semiconductor relay 20 are connected to each other. Further, inside the package 2, one of the pair of output parts 321, 331 of the third semiconductor relay 30 is connected to the third output terminal 62, and the other of the pair of output parts 321, 331 of the third semiconductor relay 30 is connected to a connection midpoint 34 between the other of the pair of output parts 121, 131 of the first semiconductor relay 10 and the other of the pair of the output parts 221, 231 of the second semiconductor relay 20.

In the semiconductor relay module 1, inside the package 2, the pair of input parts 111, 112, the pair of input parts 211, 212, and the pair of input parts 311, 312 of the semiconductor relays 10, 20, 30 are each connected to one of the input terminals 41, 51, 61 corresponding to the respective semiconductor relays 10, 20, 30. That is, since each of the corresponding semiconductor relays 10, 20, 30 is provided with one of the corresponding input terminals 41, 51, 61, it is possible to achieve the semiconductor relay module 1 that can facilitate designing of the circuit board. It is thereby possible to reduce transmission loss of a high-frequency signal by avoiding a complicated wiring configuration in which peripheral wires cross each other on the circuit board.

Further, in the semiconductor relay module 1, the pair of output parts 121, 131, the pair of input parts 221, 231, and the pair of input parts 321, 331 of the semiconductor relays 10, 20, 30 are each connected to one of the output terminals 42, 52, 62 corresponding to the respective semiconductor relays 10, 20, 30. That is, since each of the corresponding semiconductor relays 10, 20, 30 is provided with one of the corresponding output terminals 42, 52, 62, it is possible to achieve the semiconductor relay module 1 that can facilitate designing of the circuit board.

Figure 3:
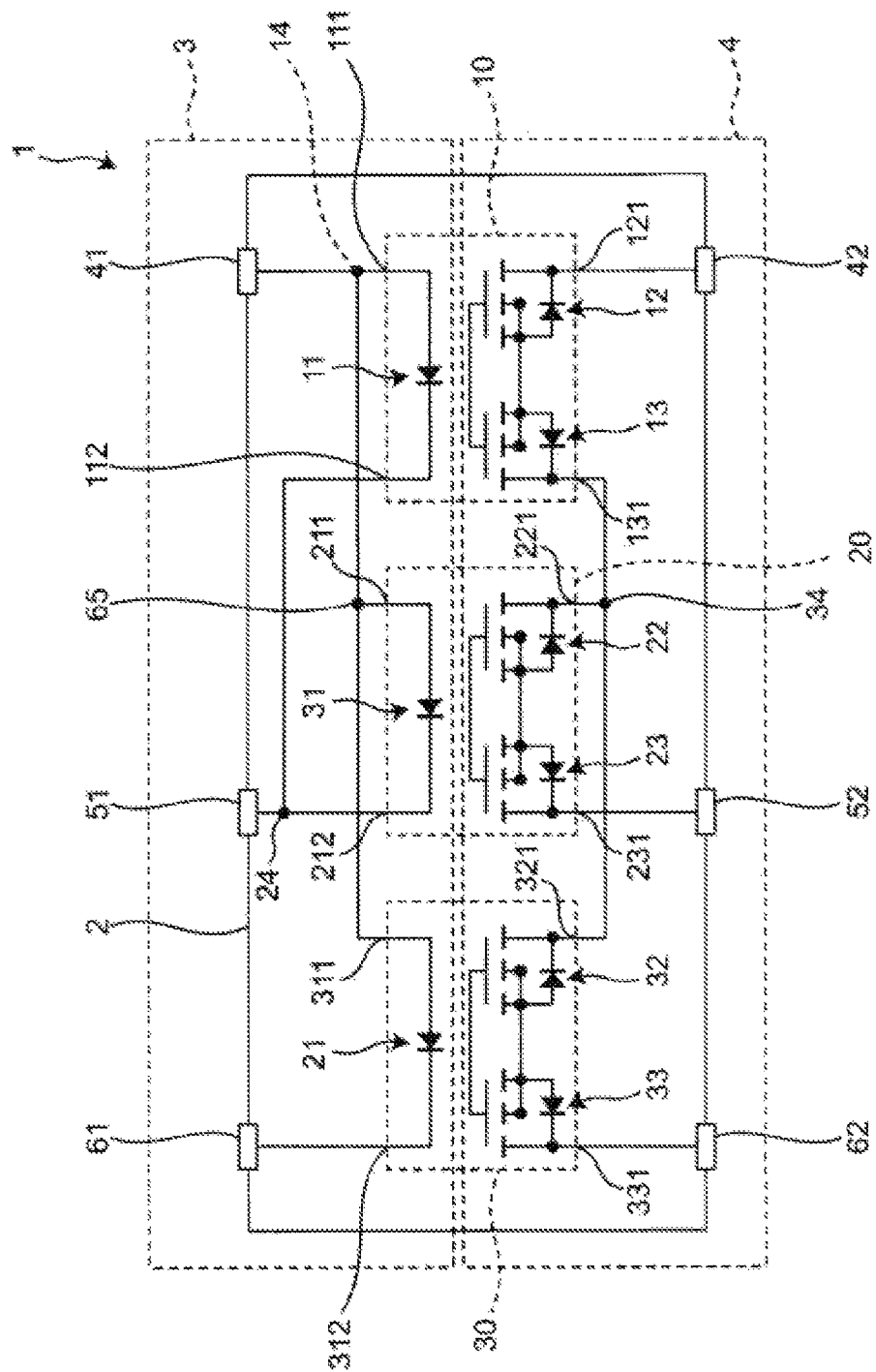
FIG. 3 is a configuration diagram showing another example of the semiconductor relay module of FIG. 1.

In the semiconductor relay module 1, the third semiconductor relay 30 is disposed between the first semiconductor relay 10 and the second semiconductor relay 20, but this is not restrictive. For example, as shown in FIG. 3, inside the rectangular package 2 in a plan view of FIG. 3, the first semiconductor relay 10, the second semiconductor relay 20, and the third semiconductor relay 30 are arranged along the longitudinal direction of the package 2, and the second semiconductor relay 20 may be disposed between the first semiconductor relay 10 and the third semiconductor relay 30. This can enhance the frequency of design of the semiconductor relay module 1.

Further each of the first semiconductor relay 10, the second semiconductor relay 20, and the third semiconductor relay 30 may be a two-low-terminal capacitance type semiconductor relay with a capacitance between output terminals being greater than zero and 12 pF or less (e.g., a semiconductor relay with a capacitance between output terminals being 0.8 pF and an output on-resistance of 3Ω.) This can improve the high-frequency isolation property of the semiconductor relay module 1.

For the two-low-terminal capacitance type semiconductor relay in the present disclosure, a semiconductor relay with a capacitance between output terminals being greater than zero and 0.8 pF or less is more preferred, and a semiconductor relay with a capacitance between output terminals being greater than zero and 0.2 pF or less is still more preferred. For example, when each of the first semiconductor relay 10, the second semiconductor relay 20, and the third semiconductor relay 30 is formed of a two-low-terminal capacitance type semiconductor relay with a capacitance between output terminals being greater than zero and 0.8 pF or less, in the opening or closing of a 1-GHz signal, an isolation of 30 dB or more can be expected. Further, when each of the first semiconductor relay 10, the second semiconductor relay 20, and the third semiconductor relay 30 is formed of a two-low-terminal capacitance type semiconductor relay with a capacitance between output terminals being greater than zero and 0.2 pF or less, in the opening or closing of a 1-GHz signal, an isolation of 35 dB or more can be expected.

Further, each of the first semiconductor relay 10 and the second semiconductor relay 20 may be formed of a low on-resistance type semiconductor relay with an output on-resistance being greater than zero and a low on-resistance of 7Ω or less (e.g., a semiconductor relay with a capacitance between output terminals being 5 pF and an output on-resistance of 0.8Ω), and the third semiconductor relay 30 may be formed of a two-low-terminal capacitance type semiconductor relay with a capacitance between output terminals being greater than zero 12 pF or less (e.g., a semiconductor relay with a capacitance between output terminals being 0.8 pF and an output on-resistance of 3Ω). Thereby, in addition to the high-frequency isolation property of the semiconductor relay module 1, the high-frequency insertion loss property can be improved. Note that the same effect can be obtained when only one of the first semiconductor relay 10 and the second semiconductor relay 20 is formed of a low on-resistance type semiconductor relay.

Since the low-terminal capacitance property and the on-resistance property during operation have a contrary relationship, when all the semiconductor relays 10, 20, 30 of the semiconductor relay module 1 are formed of two-low-terminal capacitance type semiconductor relays, the high-frequency isolation property can be improved, but it is difficult to improve the high-frequency insertion loss property at the same time. Therefore, as described above, the third semiconductor relay 30 connected to the grounding point is formed of a two-low-terminal capacitance type semiconductor relay, and at least one of the first semiconductor relay 10 and the second semiconductor relay 20 connected in series is formed of a low on-resistance type semiconductor relay, so that it is possible to achieve a semiconductor relay module 1 with favorable insertion loss and isolation properties.

For the low on-resistance type semiconductor relay in the present disclosure, a semiconductor relay with an output on-resistance being greater than zero and 1.2Ω or less is more preferred, and a semiconductor relay with an output on-resistance being greater than zero and 0.1Ω or less is still more preferred.

Further, the semiconductor relay is not limited to the semiconductor relays 10, 20, 30 of the above embodiment, and a semiconductor relay with another structure may be used.

Further, in the semiconductor relay module 1, the first input part 311, which is the other of the pair of input parts 311, 312 of the third semiconductor relay 30, is connected to the first input terminal 41 via the midpoint 14 of the connection line connecting the first input part 111 of the first semiconductor relay 10 and the first input terminal 41, but this is not restrictive. For example, the first input part 311, which is the other of the pair of input parts 311, 312 of the third semiconductor relay 30, may be connected to the second input terminal 51 via the midpoint of the connection line connecting the second input part 212 of the second semiconductor relay 20 and the second input terminal 51.

The semiconductor relay module of the present disclosure may only include at least the first semiconductor relay and the second semiconductor relay connected in series, and the third semiconductor relay disposed between the grounding point and the connection midpoint of the first semiconductor relay 10 and the second semiconductor relay 20. The semiconductor relay module may include four or more semiconductor relays.

A variety of embodiments of the present disclosure have been described in detail with reference to the drawings, and lastly, a variety of aspects of the present disclosure will be described. In the following description, as an example, reference symbols are also attached.

A semiconductor relay module 1 of a first aspect of the present disclosure includes: a first semiconductor relay 10 and a second semiconductor relay 20 connected in series; a third semiconductor relay 30 disposed between a grounding point 64 and a connection midpoint 34, 65 of the first semiconductor relay 10 and the second semiconductor relay 20; a package 2 configured to house the first semiconductor relay 10, the second semiconductor relay 20, and the third semiconductor relay 30; and a first input terminal 41, a second input terminal 51, and a third input terminal 61 that are provided in the package 2 and disposed so as to be partially exposed to an outside of the package 2. Each of the first semiconductor relay 10, the second semiconductor relay 20, and the third semiconductor relay 30 has a pair of input parts 111, 112, 211, 212, 311, 312, and inside the package 2, one of the pair of input parts 111, 112 of the first semiconductor relay 10 is connected to the first input terminal 41, the other of the pair of input parts 111, 112 of the first semiconductor relay 10 is connected to the second input terminal 51, one of the pair of input parts 211, 212 of the second semiconductor relay 20 is connected to the second input terminal 51, the other of the pair of input parts 211, 212 of the second semiconductor relay 20 is connected to the first input terminal 41, one of the pair of input parts 311, 312 of the third semiconductor relay 30 is connected to the third input terminal 61, and the other of the pair of input parts 311, 312 of the third semiconductor relay 30 is connected to the first input terminal 41 or the second input terminal 51.

According to the semiconductor relay module 1 of the first aspect, inside the package 2, the pair of input parts 111, 112, the pair of input parts 211, 212, and the pair of input parts 311, 312 of the respective semiconductor relays 10, 20, 30 are each connected to one of the input terminals 41, 51, 61 corresponding to the respective semiconductor relays 10, 20, 30. That is, since each of the corresponding semiconductor relays 10, 20, 30 is provided with one of the corresponding input terminals 41, 51, 61, it is possible to achieve the semiconductor relay module 1 that can facilitate designing of the circuit board.

A semiconductor relay module 1 of a second aspect of the present disclosure includes a first output terminal 42, a second output terminal 52, and a third output terminal 62 that are provided in the package 2 and disposed so as to be partially exposed to the outside of the package 2. Each of the first semiconductor relay 10, the second semiconductor relay 20, and the third semiconductor relay 30 has a pair of output parts 121, 131, 221, 231, 321, 331, and inside the package 2, one of the pair of output parts 121, 131 of the first semiconductor relay 10 is connected to a first output terminal 42, the one of the pair of output parts 221, 231 of the second semiconductor relay 20 is connected to the second output terminal 52, the other of the pair of output parts 121, 131 of the first semiconductor relay 10 and the other of the pair of output parts 221, 231 of the second semiconductor relay 20 are connected to each other, one of the pair of output parts 321, 331 of the third semiconductor relay 30 is connected to the third output terminal 62, and the other of the pair of output parts 321, 331 of the third semiconductor relay 30 is connected to a connection midpoint 34 between the other of the pair of output parts 121, 131 of the first semiconductor relay 10 and the other of the pair of output parts 221, 231 of the second semiconductor relay 20.

According to the semiconductor relay module of the second aspect, the pair of output parts 121, 131, the pair of input parts 221, 231, and the pair of input parts 321, 331 of the semiconductor relays 10, 20, 30 are each connected to one of the output terminals 42, 52, 62 corresponding to the respective semiconductor relays 10, 20, 30. That is, since each of the corresponding semiconductor relays 10, 20, 30 is provided with one of the corresponding output terminals 42, 52, 62, it is possible to achieve the semiconductor relay module 1 that can facilitate designing of the circuit board.

In a semiconductor relay module 1 of a third aspect of the present disclosure, the second semiconductor relay 20 is disposed between the first semiconductor relay 10 and the third semiconductor relay 30.

According to the semiconductor relay module of the third aspect, it is possible to enhance the frequency of design of the semiconductor relay module 1.

In a semiconductor relay module 1 of a fourth aspect of the present disclosure, the third semiconductor relay 30 is disposed between the first semiconductor relay 10 and the second semiconductor relay 20.

According to the semiconductor relay module of the fourth aspect, it is possible to enhance the frequency of design of the semiconductor relay module 1.

In a semiconductor relay module 1 of a fifth aspect of the present disclosure, each of the first semiconductor relay 10, the second semiconductor relay 20, and the third semiconductor relay 30 is a two-low-terminal capacitance type semiconductor relay with a capacitance between output terminals being greater than zero and 12 pF or less.

According to the semiconductor relay module 1 of the fifth aspect, it is possible to improve the high-frequency isolation property of the semiconductor relay module 1.

In a semiconductor relay module 1 of a sixth aspect of the present disclosure, each of the first semiconductor relay 10 and the second semiconductor relay 20 is a low on-resistance type semiconductor relay with an output on-resistance being greater than zero and 7Ω or less, and the third semiconductor relay 30 is a two-low-terminal capacitance type semiconductor relay with a capacitance between output terminals being greater than zero and 12 pF or less.

According to the semiconductor relay module 1 of the sixth aspect, in addition to the high-frequency isolation property of the semiconductor relay module 1, the high-frequency insertion loss property can be improved.

By appropriately combining freely selected embodiments or modified examples of the above variety of embodiments or modified examples, the respective effects of those combined can be exerted. While it is possible to combine embodiments, combine examples, or combine an embodiment and an example, it is also possible to combine features in different embodiments or examples.

While the present disclosure has been fully described in connection with the preferred embodiments with reference to the accompanying drawings, a variety of modified examples or corrections will be apparent to those skilled in the art. Such modifications or amendments are to be understood as being included in the scope of the present disclosure according to the appended claims so long as not deviating therefrom.

INDUSTRIAL APPLICABILITY

The semiconductor relay module of the present disclosure can be applied to, for example, a semiconductor inspection device, a measuring instrument, and a programmable controller.

DESCRIPTION OF SYMBOLS 1 semiconductor relay module
2 package 10 first semiconductor relay
11 light-emitting element
111 first input part
112 second input part
12, 13 MOSFET
121, 131 output part
14 midpoint
20 Second semiconductor relay
21 light-emitting element
211 first input part
212 second input part
22, 23 MOSFET
221, 231 output part
24 midpoint
30 third semiconductor relay
31 light-emitting element
311 first input part
312 second input part
32, 33 MOSFET
321, 331 output part
41 first input terminal
42 first output terminal
43 power supply terminal
44 first external output terminal
45 midpoint
51 second input terminal
52 second output terminal
53 CONT terminal
54 second external output terminal
55 midpoint
61 third input terminal
62 third output terminal
63 midpoint
64 grounding point
65 connection midpoint
71, 72, 72 connecting wire

The invention claimed is:

1. A semiconductor relay module comprising:
a first semiconductor relay and a second semiconductor relay connected in series;
a third semiconductor relay disposed between a grounding point and a connection midpoint of the first semiconductor relay and the second semiconductor relay;
a package configured to house the first semiconductor relay, the second semiconductor relay, and the third semiconductor relay, wherein the first semiconductor relay, the second semiconductor relay, and the third semiconductor relay are arranged along a longitudinal direction of the package; and
a first input terminal, a second input terminal, and a third input terminal that are provided in the package and disposed so as to be partially exposed to an outside of the package,
wherein
each of the first semiconductor relay, the second semiconductor relay, and the third semiconductor relay has a pair of input parts, and
inside the package, one of the pair of input parts of the first semiconductor relay is connected to the first input terminal, another of the pair of input parts of the first semiconductor relay is connected to the second input terminal, one of the pair of input parts of the second semiconductor relay is connected to the second input terminal, another of the pair of input parts of the second semiconductor relay is connected to the first input terminal, one of the pair of input parts of the third semiconductor relay is connected to the third input terminal, and another of the pair of input parts of the third semiconductor relay is connected to the first input terminal or the second input terminal.

2. The semiconductor relay module according to claim 1, further comprising
a first output terminal, a second output terminal, and a third output terminal that are provided in the package and disposed so as to be partially exposed to the outside of the package,
wherein
each of the first semiconductor relay, the second semiconductor relay, and the third semiconductor relay has a pair of output parts, and
inside the package, one of the pair of output parts of the first semiconductor relay is connected to a first output terminal, one of the pair of output parts of the second semiconductor relay is connected to the second output terminal, another of the pair of output parts of the first semiconductor relay and another of the pair of output parts of the second semiconductor relay are connected to each other, one of the pair of output parts of the third semiconductor relay is connected to the third output terminal, and another of the pair of output parts of the third semiconductor relay is connected to a connection midpoint between the other of the pair of output parts of the first semiconductor relay and the other of the pair of output parts of the second semiconductor relay.

3. The semiconductor relay module according to claim 2, wherein the second semiconductor relay is disposed between the first semiconductor relay and the third semiconductor relay.

4. The semiconductor relay module according to claim 2, wherein the third semiconductor relay is disposed between the first semiconductor relay and the second semiconductor relay.

5. The semiconductor relay module according to claim 2, wherein each of the first semiconductor relay, the second semiconductor relay, and the third semiconductor relay is a two-low-terminal capacitance type semiconductor relay with a capacitance between output terminals being greater than zero and less than or equal to 12 pF.

6. The semiconductor relay module according to claim 2, wherein
each of the first semiconductor relay and the second semiconductor relay is a low on-resistance type semiconductor relay with an output on-resistance being greater than zero and less than or equal to 7Ω, and
the third semiconductor relay is a two-low-terminal capacitance type semiconductor relay with a capacitance between output terminals being greater than zero and less than or equal to 12 pF.

7. The semiconductor relay module according to claim 1, wherein the second semiconductor relay is disposed between the first semiconductor relay and the third semiconductor relay.

8. The semiconductor relay module according to claim 7, wherein each of the first semiconductor relay, the second semiconductor relay, and the third semiconductor relay is a two-low-terminal capacitance type semiconductor relay with a capacitance between output terminals being greater than zero and less than or equal to 12 pF.

9. The semiconductor relay module according to claim 7, wherein
each of the first semiconductor relay and the second semiconductor relay is a low on-resistance type semiconductor relay with an output on-resistance being greater than zero and less than or equal to 7Ω, and the third semiconductor relay is a two-low-terminal capacitance type semiconductor relay with a capacitance between output terminals being greater than zero and less than or equal to 12 pF.

10. The semiconductor relay module according to claim 1, wherein the third semiconductor relay is disposed between the first semiconductor relay and the second semiconductor relay.

11. The semiconductor relay module according to claim 10, wherein each of the first semiconductor relay, the second semiconductor relay, and the third semiconductor relay is a two-low-terminal capacitance type semiconductor relay with a capacitance between output terminals being greater than zero and less than or equal to 12 pF.

12. The semiconductor relay module according to claim 10, wherein
each of the first semiconductor relay and the second semiconductor relay is a low on-resistance type semiconductor relay with an output on-resistance being greater than zero and less than or equal to 7Ω, and
the third semiconductor relay is a two-low-terminal capacitance type semiconductor relay with a capacitance between output terminals being greater than zero and less than or equal to 12 pF.

13. The semiconductor relay module according to claim 1, wherein each of the first semiconductor relay, the second semiconductor relay, and the third semiconductor relay is a two-low-terminal capacitance type semiconductor relay with a capacitance between output terminals being greater than zero and less than or equal to 12 pF.

14. The semiconductor relay module according to claim 1, wherein
each of the first semiconductor relay and the second semiconductor relay is a low on-resistance type semiconductor relay with an output on-resistance being greater than zero and less than or equal to 7Ω, and
the third semiconductor relay is a two-low-terminal capacitance type semiconductor relay with a capacitance between output terminals being greater than zero and less than or equal to 12 pF.

* * * * *